United States Patent
Yabu et al.

(10) Patent No.: US 8,604,451 B2
(45) Date of Patent: Dec. 10, 2013

(54) TARGET SUPPLY APPARATUS

(75) Inventors: Takayuki Yabu, Hiratsuka (JP); Masaki Nakano, Yokohama (JP); Hitoshi Nagano, Hiratsuka (JP); Takanobu Ishihara, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 885 days.

(21) Appl. No.: 12/642,308

(22) Filed: Dec. 18, 2009

(65) Prior Publication Data
US 2010/0213272 A1 Aug. 26, 2010

(30) Foreign Application Priority Data

Dec. 19, 2008 (JP) ................................. 2008-324497
Dec. 16, 2009 (JP) ................................. 2009-285787

(51) Int. Cl.
*H05G 2/00* (2006.01)
*G01J 3/10* (2006.01)
*A61N 5/06* (2006.01)

(52) U.S. Cl.
USPC ....... 250/504 R; 250/284; 250/428; 250/429; 239/690

(58) Field of Classification Search
USPC .............. 250/504 R, 428, 429, 284; 239/690
See application file for complete search history.

(56) References Cited

U.S. PATENT DOCUMENTS

| | | | | |
|---|---|---|---|---|
| 5,560,543 A | * | 10/1996 | Smith et al. | 239/102.2 |
| 5,646,666 A | | 7/1997 | Cowger et al. | |
| 7,368,742 B2 | | 5/2008 | Hergenhan et al. | |
| 7,372,057 B2 | * | 5/2008 | Gaebel et al. | 250/504 R |
| 7,599,470 B2 | * | 10/2009 | Kloepfel et al. | 378/119 |
| 7,615,766 B2 | | 11/2009 | Nakano | |
| 2004/0000637 A1 | * | 1/2004 | Wieland | 250/284 |
| 2006/0017026 A1 | * | 1/2006 | Hergenhan et al. | 250/504 R |

FOREIGN PATENT DOCUMENTS

| | | |
|---|---|---|
| JP | 6-183030 A | 7/1994 |
| JP | 2006-086110 A | 3/2006 |
| JP | 2007-142306 A | 6/2007 |
| JP | 2007-266234 | 10/2007 |

OTHER PUBLICATIONS

Japanese Office Action issued in Japanese Application No. 2009-285787 dated Sep. 10, 2013 with English Translation.

* cited by examiner

*Primary Examiner* — Dinh Q Nguyen
(74) *Attorney, Agent, or Firm* — McDermott Will & Emery LLP

(57) ABSTRACT

A target supply apparatus controls a gas pressure inside a tank storing a liquid target material to be outputted from a nozzle by a pressure of gas supplied from a gas supply having a pressure regulator. The target supply apparatus comprises a gas passage introducing gas supplied from the gas supply into the tank, and a high-precision pressure regulator arranged on the gas passage and regulating a pressure of gas flowing the gas passage. The high-precision pressure regulator is able to regulate pressure with accuracy higher than the pressure regulator.

26 Claims, 10 Drawing Sheets

TARGET SUPPLY APPARATUS

CROSS-REFERENCE TO RELATED APPLICATIONS

This application is based upon and claims the benefit of priority from the prior Japanese Patent Applications No. 2008-324497, filed on Dec. 19, 2008, and No. 2009-285787, filed on Dec. 16, 2009; the entire contents of which are incorporated herein by reference.

BACKGROUND OF THE INVENTION

1. Field of the Invention

The present invention relates to a target supply apparatus used for an extreme ultraviolet light source apparatus which generates an extreme ultraviolet (EUV: extreme ultraviolet) light from a plasma generated by irradiating a target with a laser light.

2. Description of the Related Art

In recent years, along with a progress in miniaturization of semiconductor device, miniaturization of transcription pattern used in photolithography in a semiconductor process has developed rapidly. In the next generation, microfabrication to the extent of 65 nm to 32 nm, or even to the extent of 30 nm and beyond will be required. Therefore, in order to comply with the demand of microfabrication to the extent of 30 nm and beyond, development of such exposure apparatus combining an extreme ultraviolet (EUV) light source for a wavelength of about 13 nm and a reduced reflective optics is expected.

As the EUV light source, there are three possible types, which are a laser produced plasma (LPP) light source using plasma generated by irradiating a target with a laser beam, a discharge produced plasma (DPP) light source using plasma generated by electrical discharge, and a synchrotron radiation (SR) light source using orbital radiant light. Among these light sources, the LPP light source has such advantages that luminance can be made extremely high as close to the blackbody radiation because plasma density can be made higher compared with the DPP light source and the SR light source. Moreover, the LPP light source also has an advantage that strong luminescence only with a desired wavelength band is possible by selecting a target material. Furthermore, the LPP light source has such advantages that there is no construction such as electrode around a light source because the light source is a point light source with nearly isotropic angular distributions, extremely wide collecting solid angle can be acquired, and so on. Accordingly, the LPP light source having such advantages is expected as a light source for EUV lithography which requires more than several dozen to several hundred watt power.

In the EUV light source apparatus with the LPP system, firstly, a target material supplied inside a vacuum chamber is excited by irradiation with a laser light and thus be turned into plasma (cf. Japanese patent application Laid-Open No. 2007-266234). Then, a cocktail light with various wavelength components including an EUV light is emitted from the generated plasma. Then, the EUV light source apparatus focuses the EUV light by reflecting the EUV light using an EUV collector mirror which selectively reflects an EUV light with a desired wavelength, e.g. a 13.5 nm wavelength component. The reflected EUV light is inputted to an exposure apparatus. On a reflective surface of the EUV collector mirror, a multilayer coating with a structure in that thin coating of molybdenum (Mo) and thin coating of silicon (Si) are alternately stacked, for instance, is formed. The multilayer coating exhibits a high reflectance ratio (of about 60% to 70%) with respect to the EUV light with a 13.5 nm wavelength.

Here, it is preferable that a variation of a focus position on which the extreme ultraviolet light is to be focused by the collector mirror, that is, a variation of a position from which the extreme ultraviolet light is emitted from a target with respect to a position of the collector mirror is limited within a predetermined range. This is because, the variation of the focus position of the extreme ultraviolet light may induce uneven exposure, or the like, at the exposure. In order to suppress the variation of focus position of the extreme ultraviolet light, it is necessary to suppress variation of a position where a target is turned into plasma by irradiation with a laser beam.

BRIEF SUMMARY OF THE INVENTION

In accordance with one aspect of the present invention, a target supply apparatus controls a gas pressure inside a tank storing a liquid target material to be outputted from a nozzle by a pressure of gas supplied from a gas supply having a pressure regulator. The target supply apparatus comprises a gas passage introducing gas supplied from the gas supply into the tank, and a high-precision pressure regulator arranged on the gas passage and regulating a pressure of gas flowing the gas passage. The high-precision pressure regulator is able to regulate pressure with accuracy higher than the pressure regulator.

These and other objects, features, aspects, and advantages of the present invention will become apparent to those skilled in the art from the following detailed description, which, taken in conjunction with the annexed drawings, discloses preferred embodiments of the present invention.

DETAILED DESCRIPTION OF THE INVENTION

Now, exemplary embodiments of a target supply apparatus, a control system, a control device and a control circuit of the target supply apparatus according to the present invention will be described in detail with reference to the accompanying drawings.

First Embodiment

Figure 1:
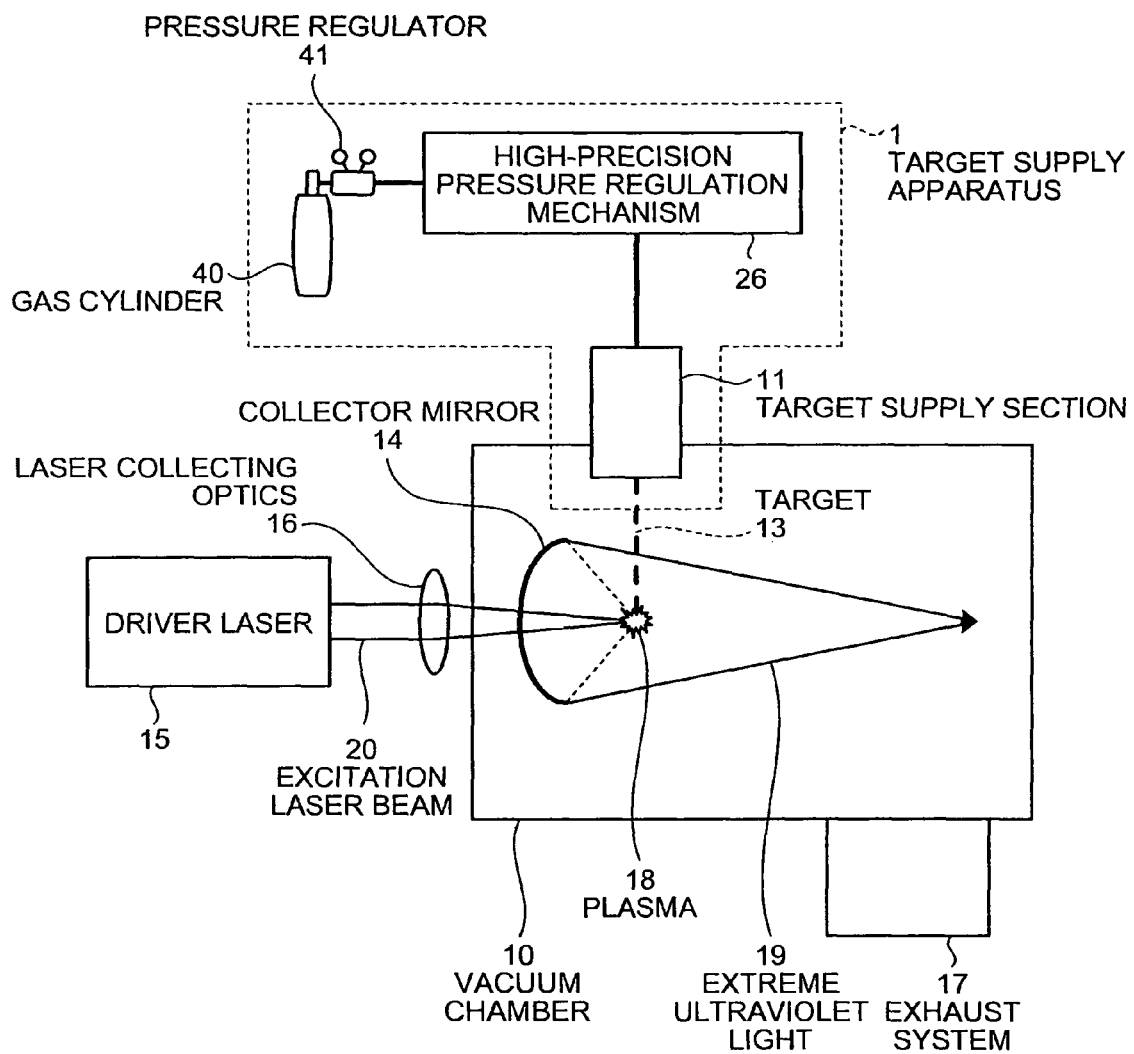
FIG. 1 is a schematic diagram showing a structure of an extreme ultraviolet light source apparatus using a target supply apparatus according to a first embodiment of the present invention.

FIG. 1 is a schematic diagram showing a structure of an extreme ultraviolet light source apparatus using a target supply apparatus according to a first embodiment of the present invention. The extreme ultraviolet light source apparatus shown in FIG. 1 adopts a laser produced plasma (LPP) system which generates an extreme ultraviolet light from a target material excited by irradiating the target material with a laser beam.

As shown in FIG. 1, the extreme ultraviolet light source apparatus has a vacuum chamber 10 in which generation of an extreme ultraviolet light is to be executed, a target supply section 11 supplying a target 13 to a predetermined position in the vacuum chamber 10, a gas cylinder 40 supplying a gas for pressurizing the target 13 in the target supply section 11 in order to supply the target 13, a pressure regulator 41 adjusting a pressure of the pressure gas, a high-precision pressure regulation mechanism 26 adjusting the pressure of the pressure gas with a high degree of accuracy, a driver laser 15 generating an excitation laser beam 20 with which the target 13 is to be irradiated, a laser focusing optics 16 focusing the excitation laser beam 20 generated by the driver laser 15, a collector mirror 14 emitting and focusing an extreme ultraviolet light 19 emitted from a plasma 18 generated by irradiating the target 13 with the excitation laser light 20, and an exhaust system 17 for maintaining inside the vacuum chamber 10 in vacuum. Here, the target supply section 11, the gas cylinder 40, the pressure regulator 41, and the high-precision pressure regulation mechanism 26 constitute a target supply apparatus 1.

The target supply apparatus 1 supplying the target to the inside of the vacuum chamber has a tank 30 filled with a target material such as molten liquid Sn, Li, or the like. The target material (molten Sn 34) inside the tank 30 is melted by a heater 33 mounted on an outer wall of the tank 30. The target supply apparatus 1 pressures the tank 30 storing the molten target material by using the gas from the gas cylinder 40 of which pressure is reduced by the pressure regulator 41. Thereby, a molten metal which is the target 13 is outputted from a nozzle 31 attached to a head of the tank 30. The target 13 is outputted in a form of a jet or a droplet. The droplet can be generated using a continuous jet method, for instance. In the continuous jet method, a regular disturbance is applied on a jet surface of the molten metal using a vibration element such as a piezoelectric element 32. Thereby, droplets with even volumes are outputted from the nozzle.

When the excitation laser beam 20 emitted from the driver laser 15 is focused on the predetermined position in the vacuum chamber 10 via the laser focusing optics 16 while the target 13 is supplied from the target supply apparatus 1 to the predetermined position in the vacuum chamber 10, the plasma 18 is generated by irradiating the target 13 with the excitation laser beam 20. After that, the extreme ultraviolet light 19 is emitted from the plasma 18. The collector mirror 14 outputs the extreme ultraviolet light 19 to the outside of the vacuum chamber 10 (not shown) while focusing the extreme ultraviolet light 19. If the excitation laser beam 20 is a pulse laser light, irradiation timing of the target 13 and pulse generation timing are controlled to be synchronous.

In the extreme ultraviolet light source apparatus, a metal (liquid or solid Sn or Li) is used as the target 13 and a carbon dioxide ($CO_2$) laser which can generate a light with a comparatively long wavelength is used as the driver laser 15, for instance. Sn can be considered as a metal with a high conversion efficiency in terms of conversion of energy of laser light to energy of extreme ultraviolet light. The conversion efficiency in a case where Sn is irradiated with the carbon dioxide laser is approximately 2 to 4%.

The laser focusing optics 16 includes at least one lens and/or one mirror. The laser focusing optics 16, as shown in FIG. 1, can be located outside the vacuum chamber 10. The laser focusing optics 16 can also be located inside the vacuum chamber 10.

The collector mirror 14 is a collecting optics selectively reflecting and focusing a predetermined wavelength component (for instance, an extreme ultraviolet light with a wavelength around 13.5 nm). The collector mirror 14 has a concave reflecting surface. On the reflecting surface, for instance, a coating stack of molybdenum (Mo) and silicon (Si) is formed, the coating stack selectively reflecting the extreme ultraviolet light with a 13.5 nm wavelength.

Here, as described above, it is preferable that a variation of a focus position on which the extreme ultraviolet light 19 is to be focused by the collector mirror 14 is limited within a predetermined range. This is because the variation of the focus position of the extreme ultraviolet light 19 may induce an uneven exposure, or the like, at the exposure. In order to suppress the variation of the focus position of the extreme ultraviolet light 19, it is necessary to suppress a variation of a position where the target 13 is turned into plasma by irradiation with the excitation laser beam 20. For suppressing the variation of the position where the target 13 is turned into plasma, it is necessary to suppress variations of a supplying velocity and a trajectory (track) of the target 13. In the continuous jet method, an average velocity V of the target 13 which is one of the variation factors of the position where the target 13 is turned into plasma is represented as the following formula 1.

$$V = \sqrt{2 \times \frac{\Delta P - Ph}{\rho}} \quad \text{(formula 1)}$$

In the formula 1, $\Delta P$ is a pressure for pressurizing the target 13 in the tank 30, Ph is a pressure loss, and $\rho$ is a density of the target material.

Moreover, under laminar flow, the pressure loss Ph is represented as the following formula 2.

$$Ph = \frac{32 \mu L V}{d^2} \quad \text{(formula 2)}$$

In the formula 2, $\mu$ is a viscosity of the target 13, L is a length of a tube of the tank 30, V is an average velocity of the target 13, and d is a diameter of the tube of the tank 30.

Figure 2:
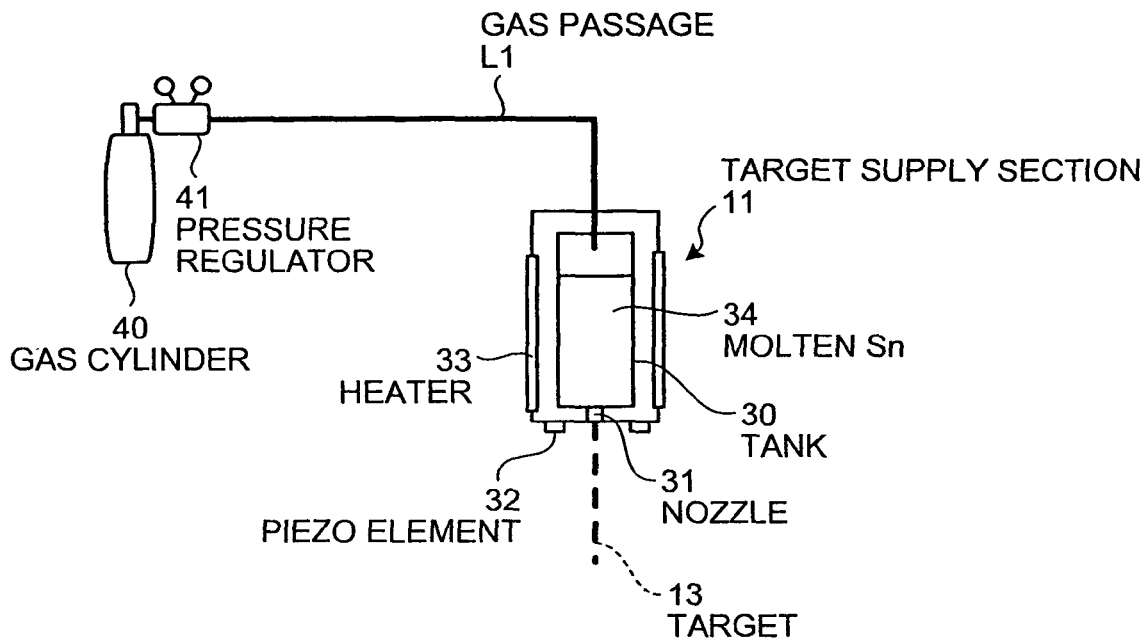
FIG. 2 is a schematic view showing a structural example of the target supply apparatus which jets a target by a continuous jet method.
Figure 3:
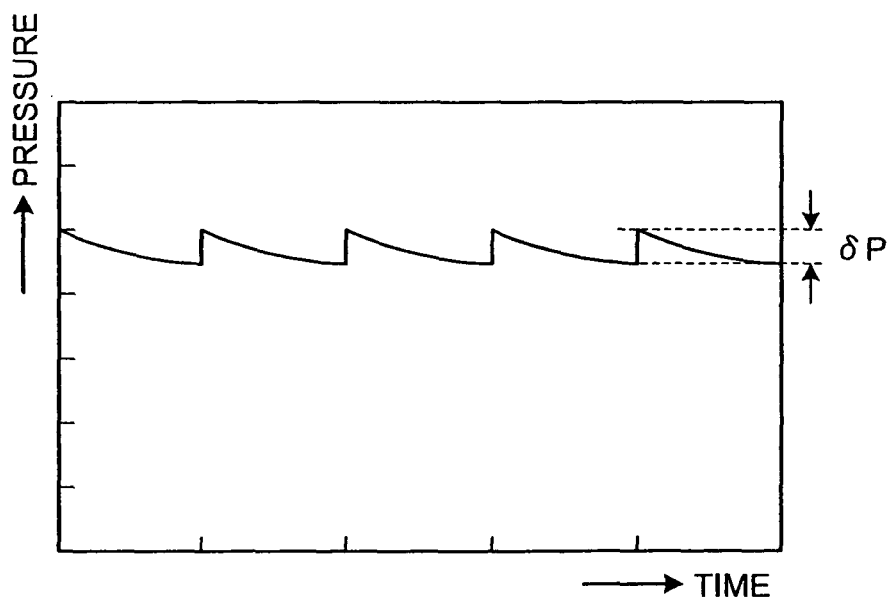
FIG. 3 is an illustration showing a time-dependent pressure variation condition inside a tank in the target supply apparatus shown in FIG. 2.

Since the density and viscosity of the target 13 depends on temperature, it can be understood from the formulas 1 and 2 that factors for changing the supplying velocity V of the target 13 includes the pressure for pressurizing the target 13 and the temperature of the target 13. FIG. 2 is a schematic view showing a structural example of the target supply apparatus which jets a target by a continuous jet method. As shown in FIG. 2, in the target supply apparatus, the gas of which pressure is reduced by the pressure regulator 41 is supplied from the gas cylinder 40 to the tank 30. By this arrangement, the pressure inside the tank 30 is pressurized to a pressure for jetting a target. As a result, the target material inside the tank 30 is pressurized and jetted from the nozzle 13 as the target 13. If the targets 13 are continuously supplied, a space filled by the gas inside the tank 30 increases. Therefore, the pressure inside the tank decreases. Therefore, the pressure of the gas supplied to the tank 30 is adjusted by using the pressure regulator 41. However, because the general pressure regulator 41 is a spring system, a pressure regulation function will not operate until a differential pressure δP becomes a certain level. Therefore, a pressure inside the tank 30, as shown FIG. 3, will change within a range of the differential pressure δP. The differential pressure δP at a time when the pressure regulator 41 operates is a few percent of the gas pressure (several MPa to few dozens MPa, for instance), e.g. few dozens kPa to a few hundred kPa. If the pressure for pressurizing the target changes by few dozens kPa to a few hundred kPa, the supplying velocity of the target 13 changes. Therefore, the position where the target 13 is turned into plasma may change greatly. As a result, uneven exposure in an exposure apparatus may occur. In order to prevent uneven exposure from occurring, it is necessary to suppress the pressure variation to 1000 Pa or less, preferably to 600 Pa or less, or further preferably to 200 Pa.

Figure 4:
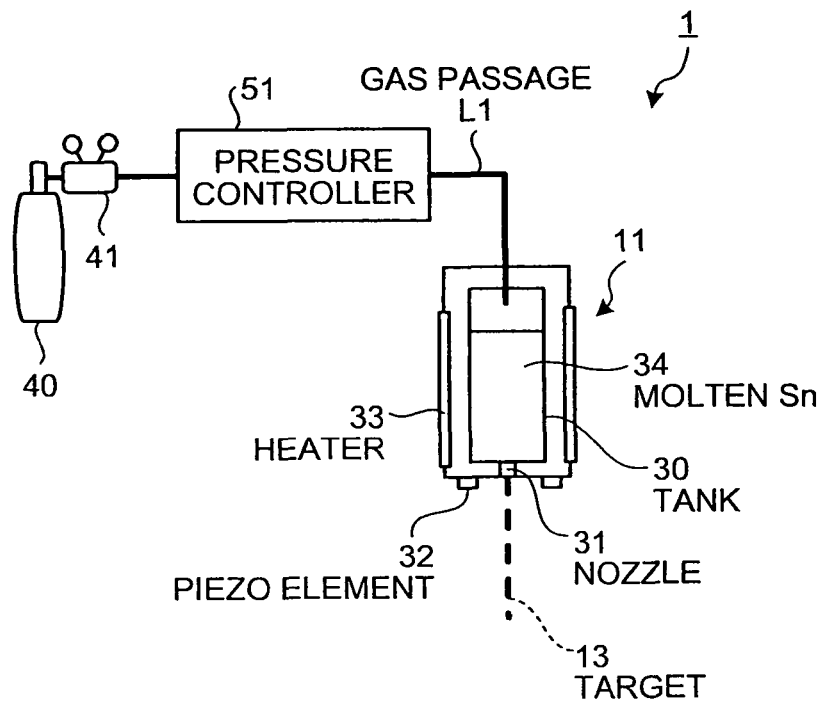
FIG. 4 is a schematic diagram showing a detailed structure of the target supply apparatus showing in FIG. 1.

This particular embodiment, as shown in FIG. 4, has the tank 30 storing molten tin (Sn) 34 inside and being able to maintain an intrinsic pressure to a high pressure or a predetermined pressure, the heater 33 as a heat regulator mounted on an outer side face of the tank 30 for melting Sn in the tank 30, the nozzle 31 jetting a molten Sn as the target 13, and the piezoelectric element 32 mounted near the nozzle 31 for continuously jetting the targets 13 as droplets from nozzle 31. FIG. 4 is a schematic diagram showing a detailed structure of the target supply apparatus shown in FIG. 1.

The pressure regulator 41 executes a pressure control autonomously so that a pressure of the gas from the gas cylinder 40 becomes a predetermined gas pressure. A set pressure of the pressure regulator 41 is set to a pressure higher than a pressure to be used inside the tank 30, e.g. 1.1 times the pressure to be used. The pressure regulator 41 and the tank 30 are connected through a gas passage L1. On the gas passage L1, a pressure controller 51 which can control a pressure with a higher degree of accuracy than the pressure regulator 41, for instance, is arranged. The pressure controller 51 controls the pressure of the gas with a high degree of accuracy so that the pressure variation of gas supplied to the tank 30 becomes under 1000 Pa, specifically, under 600 Pa. Here, it is preferable that the pressure control using a gas by the pressure controller 51 is a pressure control such that the pressure variation becomes equal to or less than 200 Pa, or further preferably falls within 30 to 200 Pa. The heater 33 executes temperature control to maintain a temperature of the molten Sn 34 in the tank 30 while the pressure controller 51 executes pressure control of the gas. Thus, by maintaining the temperature of the molten Sn 34 to a certain temperature while reducing the pressure variation inside the tank 30, it is possible to reduce the velocity variation of the target 13.

As described above, in the first embodiment, the heater 33 maintaining the temperature of the molten Sn 34 is arranged while the high-precision pressure controller 51 which can make the pressure variation equal to or less than 1 kPa is arranged between the pressure regulator 41 and the target supply section 11. By this arrangement, in the first embodiment, it is possible to reduce the velocity variation of the target 13 and suppress the variation of the position where the EUV light is focused. As a result, the extreme ultraviolet light source apparatus which is able to reduce uneven exposure occurring in an exposure apparatus can be achieved.

Second Embodiment

Figure 5:
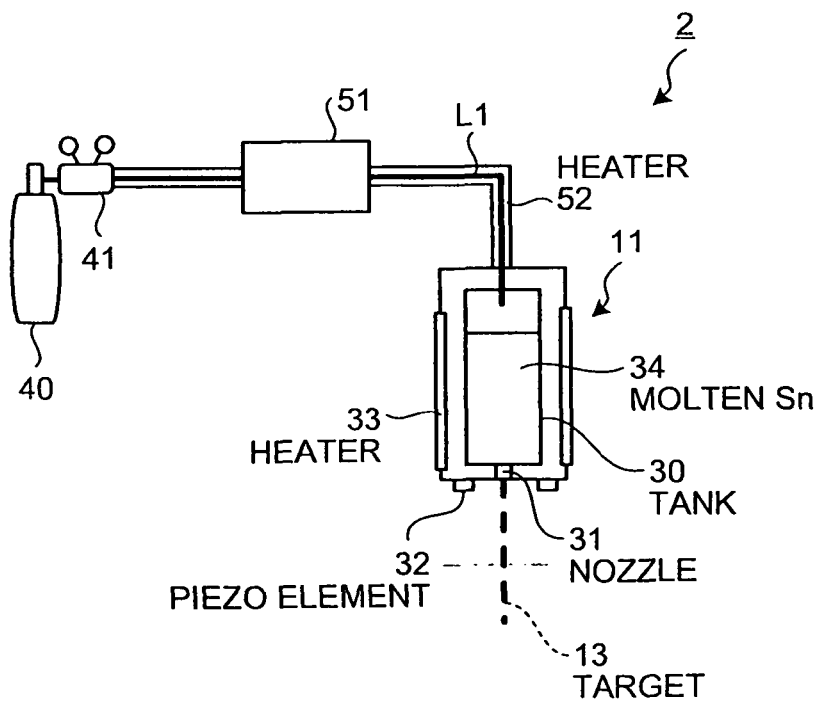
FIG. 5 is a schematic diagram showing a detailed structure of a target supply apparatus according to a second embodiment of the present invention.

FIG. 5 is a schematic diagram showing a detailed structure of a target supply apparatus according to the second embodiment of the present invention. As shown in FIG. 5, in a target supply apparatus 2 according to the second embodiment, an outside of the gas piping located on the gas passage L1 is covered with a heater 52, by overheating the gas passage L1 using the heater 52, the gas to be supplied to the tank 30 is temperature-regulated. The rest of the structure is the same as the first embodiment, and the same reference numbers will be used for referring to the parts that are the same as the parts in the first embodiment.

In order to melt Sn being the target material, it is necessary to heat the Sn at a temperature equal to or greater than a melting point (over 232° C.) of Sn. Thus, using the heater 33, the tank 30 is temperature-controlled to be equal to or greater than the melting point. On the other hand, if the gas which is to be introduced into the tank 30 from the gas cylinder 40 is not temperature-controlled, a temperature of the gas is room temperature. Therefore, the gas introduced into the tank 30 expands due to being heated up, and increases the intrinsic pressure of the tank 30. In the second embodiment, in order to control the pressure increase caused by the gas expansion, the gas is temperature-controlled by heating the gas piping using the heater 52.

It is preferable that a target temperature of the gas by the heater 52 is equal to the target temperature of the tank 30. However, only a gas being close to the high temperature tank 30 or the molten Sn 34 becomes the same temperature as the tank 30. Therefore, the temperature of the gas should not be heated up to the temperature of the tank 30, but should be heated up to about 40° C., for instance. In addition, in FIG. 5, the gas cylinder 40 is not temperature-controlled. However, when the gas passage L1 between the pressure regulator 41 and the tank 30 is short, it is preferable to temperature-control the gas cylinder 40 because the gas inside the gas cylinder 40 is introduced into the tank 30 before being heated.

As described above, in the second embodiment, the heater 52 heating the gas piping being the gas passage L1 in order to temperature-control the gas and the high-precision pressure controller 51 which can make the pressure variation being equal to or less than 1 kPa is arranged between the pressure regulator 41 and the target supply section 11. By this arrangement, because the pressure variation caused by the variation of temperature of the gas can be reduced, it is possible to reduce the velocity variation of the target 13 and suppress the variation of the position where the EUV light is to be focused. As a result, the extreme ultraviolet light source apparatus which is able to reduce uneven exposure occurring in an exposure apparatus can be achieved. Furthermore, as which the first embodiment described above, because the heater 33 maintaining the temperature of the molten Sn 34 is arranged, it is possible to reduce the velocity variation of the target 13 and suppress the variation of the position where the EUV light is to be focused. As a result, the extreme ultraviolet light source apparatus which is able to reduce uneven exposure occurring in an exposure apparatus can be achieved.

Third Embodiment

Figure 6:
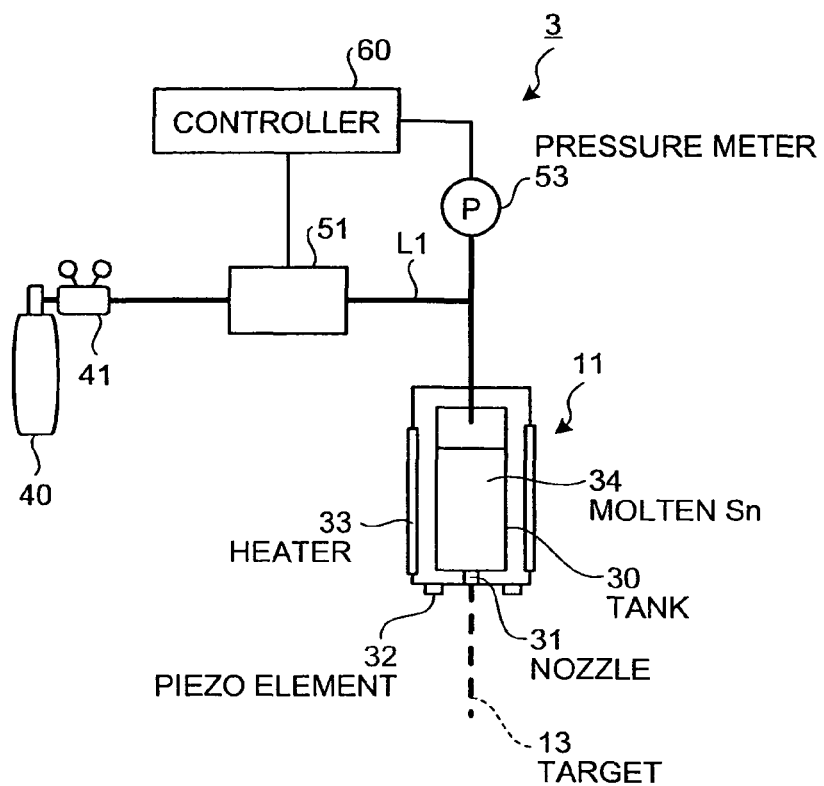
FIG. 6 is a schematic diagram showing a detailed structure of a target supply apparatus according to a third embodiment of the present invention.

Next, a third embodiment of the present invention will be described in detail. FIG. 6 is a schematic diagram showing a detailed structure of a target supply apparatus according to the third embodiment of the present invention. As shown in FIG. 6, a target supply apparatus 3 according to the third embodiment has a pressure meter 53 detecting an intrinsic pressure of the gas passage L1 near the tank 30, and a controller 60 controlling pressure control by the pressure controller 51 based on the intrinsic pressure detected by the pressure meter 53. The rest of the structure is the same as the first embodiment, and the same reference numbers will be used for referring to the parts that are the same as the parts in the first embodiment.

The pressure controller 51 shown in the above-described first embodiment executes pressure control based on a measurement value detected by an in-situ pressure mater. That is, the pressure controller 51 executes pressure control based on a pressure near the pressure controller 51. On the other hand, in the third embodiment, because the pressure meter 53 is arranged near the tank 30, it is possible to detect the pressure pressurizing the target 13 with more precision. Moreover, because the pressure pressurizing the target 13 is feed backed to the pressure controller 51 via the controller 60, the pressure controller 51 can execute the pressure control with more precision.

Figure 7:
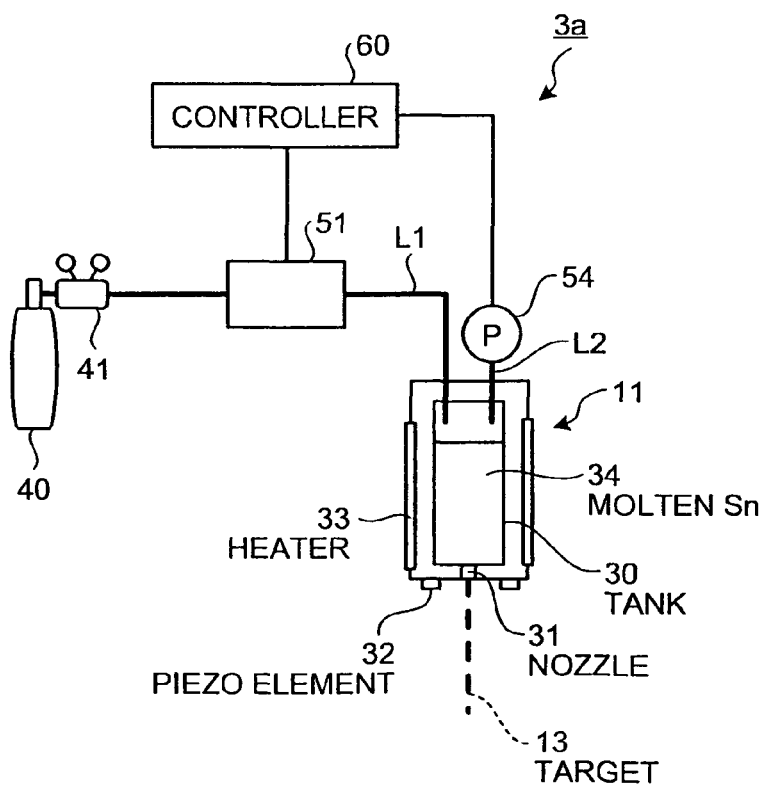
FIG. 7 is a schematic diagram showing a detailed structure of a target supply apparatus according to an alternate example of the third embodiment of the present invention.

In the third embodiment, the pressure meter 53 is arranged on the gas passage L1. However, it is not limited to such structure. For example, as the target supply apparatus 3a shown in FIG. 7, it is possible to detect a pressure near the tank by arranging a gas passage L2, which is different from the gas passage L1, and directly connected to the tank 30, and arranging a pressure meter 54 corresponding to the pressure meter 53 on one end of the gas passage L2. In this arrangement, because the pressure detected by the pressure meter 54 is not an intrinsic pressure of the gas passage L1, it is possible to reduce a pressure variation caused by a gas flow. As a result, it is possible to stably execute detection of pressure.

As described above, in the third embodiment, the pressure controller 51 executes pressure control based on the measurement value by the pressure meter 53 arranged near the tank 30 while the high-precision pressure controller 51 that can make the pressure variation equal to or less than 1 kPa is arranged between the pressure regulator 41 and the target supply section 11. By this arrangement, it is possible to execute the pressure control of the pressure pressurizing the target 13 with more precision. Moreover, as with the above-described second embodiment, by controlling the temperature of the gas by heating the gas piping being the gas passage L1 using the heater 52, it is possible to suppress the pressure variation caused by the temperature variation of the gas. Furthermore, by maintaining the temperature of the molten Sn 34 at a constant temperature by arranging the heater 33, the velocity variation of the target 13 can be reduced, and thereby, it is possible to suppress the focus position where the EUV light is to be focused. As a result, the extreme ultraviolet light source apparatus which is able to reduce uneven exposure occurring in an exposure apparatus can be achieved.

Fourth Embodiment

Figure 8:
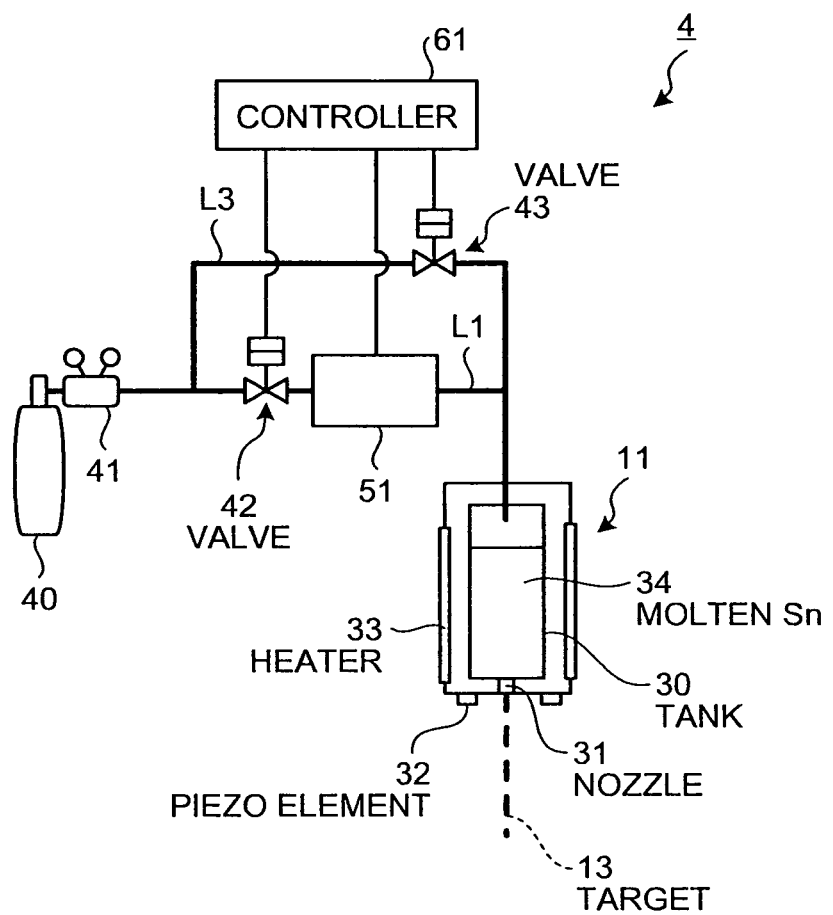
FIG. 8 is a schematic diagram showing a detailed structure of a target supply apparatus according to a fourth embodiment of the present invention.

Next, a fourth embodiment of the present invention will be described in detail. FIG. 8 is a schematic diagram showing a detailed structure of a target supply apparatus according to the fourth embodiment of the present invention. As shown in FIG. 8, a target supply apparatus 4 according to the fourth embodiment has a gas passage L3 that bypasses the pressure controller 51. A diameter of piping of the gas passage L3 is large enough to let a gas with a flow rate greater than a flow rate of the pressure controller 51 flow. Moreover, a valve 43 is arranged on the gas passage L3, and a valve 42 is arranged on the gas passage L1 between the pressure regulator 41 and the pressure controller 51 which is between a branch point of the gas passage L3 and the pressure controller 51. The rest of the structure is the same as the first embodiment, and the same reference numbers will be used for referring to the parts that are the same as the parts in the first embodiment.

Figure 9:
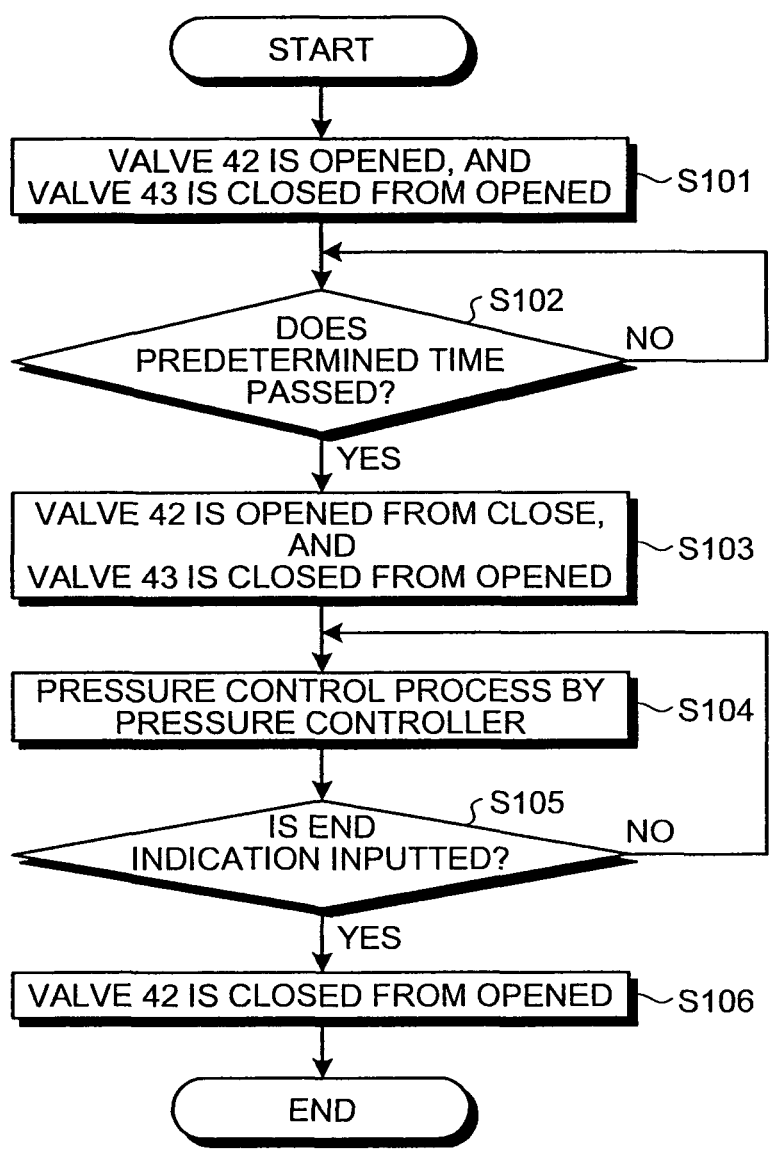
FIG. 9 is a flowchart showing a pressure control process procedure by a controller shown in FIG. 8.

A maximum gas flow of the pressure controller 51 that executes the high-precision pressure control is small. Therefore, if the inside of the tank 30 is to be pressurized only via the pressure controller 51, pressure rising time becomes long. Therefore, in the fourth embodiment, by arranging such that the inside of the tank 30 is pressurized via the gas passage L3 being a bypass line, it is possible to shorten the pressure rising time even if the pressure controller 51 is to be arranged. Here, a gas pressure control process procedure inside the tank 30 by a controller 61 corresponding to the controller 60 will be described in detail with reference to a flowchart shown in FIG. 9. In FIG. 9, firstly, the controller 61 closes the valve 43 from an open state while it keeps the valve 42 in a close state (step S101). Thereby, because the gas flows into the tank 30 via the gas passage L3 as a large flow, pressure rising inside the tank 30 is executed in a short time.

After that, the controller 61 determines whether or not predetermined time has passed (step S102). The predetermined time, for instance, is time necessary for the gas pressure inside the tank 30 to become approximately 90% of the gas pressure for jetting the target, the predetermined time previously being determined based on experiment or simulation. In addition, as with the above-described third embodiment, it is possible to arrange the pressure meter 53 and determine as to whether or not the pressure detected by the pressure meter 53 becomes equal to or greater than 90% of the gas pressure for jetting the target.

If the predetermined time has not passed, as a result of the determination in the step S102 (step S102, No), the controller 61 repeats the determination process in step S102. On the other hand, if the predetermined time has passed (step S102, Yes), the controller 61 closes the valve 43 from the open state while it opens the valve 42 from the close state (step S103), and then executes a high-precision pressure control process using the controller 51 (step S104).

Next, the controller 61 determines whether or not an end instruction has been inputted from a main controller (not shown), or the like, (step S105). If the end instruction has not been inputted (step S105, No), the controller 61 proceeds to step S104 and continues the high-precision pressure control by the pressure controller 51. On the other hand, if the end instruction has been inputted (step S105, Yes), the controller 61 closes the valve 42 from the open state (step S106), and then finishes the operation.

As described above, in the fourth embodiment, the gas passage L3 bypassing the pressure controller 51 is arranged in order to pressurize inside the tank 30 via the gas passage L3 when the gas pressure in the tank 30 is rising, while the high-precision pressure controller 51 that can make the pressure variation equal to or less than 1 kPa is arranged between the pressure regulator 41 and the target supply section 11. Thereby, it is possible to execute the high-precision pressure control while it possible to shorten the pressure rising time. Therefore, it is possible to reduce the velocity variation of the target 13 and suppress the variation of the focus position where the EUV light is to be focused. As a result, the extreme ultraviolet light source apparatus which is able to reduce uneven exposure occurring in an exposure apparatus can be achieved. Furthermore, as with the first embodiment described above, because the heater 33 that maintains the temperature of the molten Sn 34 is arranged, it is possible to reduce the velocity variation of the target 13 and suppress the variation of the position where the EUV light is to be focused. As a result, the extreme ultraviolet light source apparatus which is able to reduce uneven exposure occurring in an exposure apparatus can be achieved.

Fifth Embodiment

Figure 10:
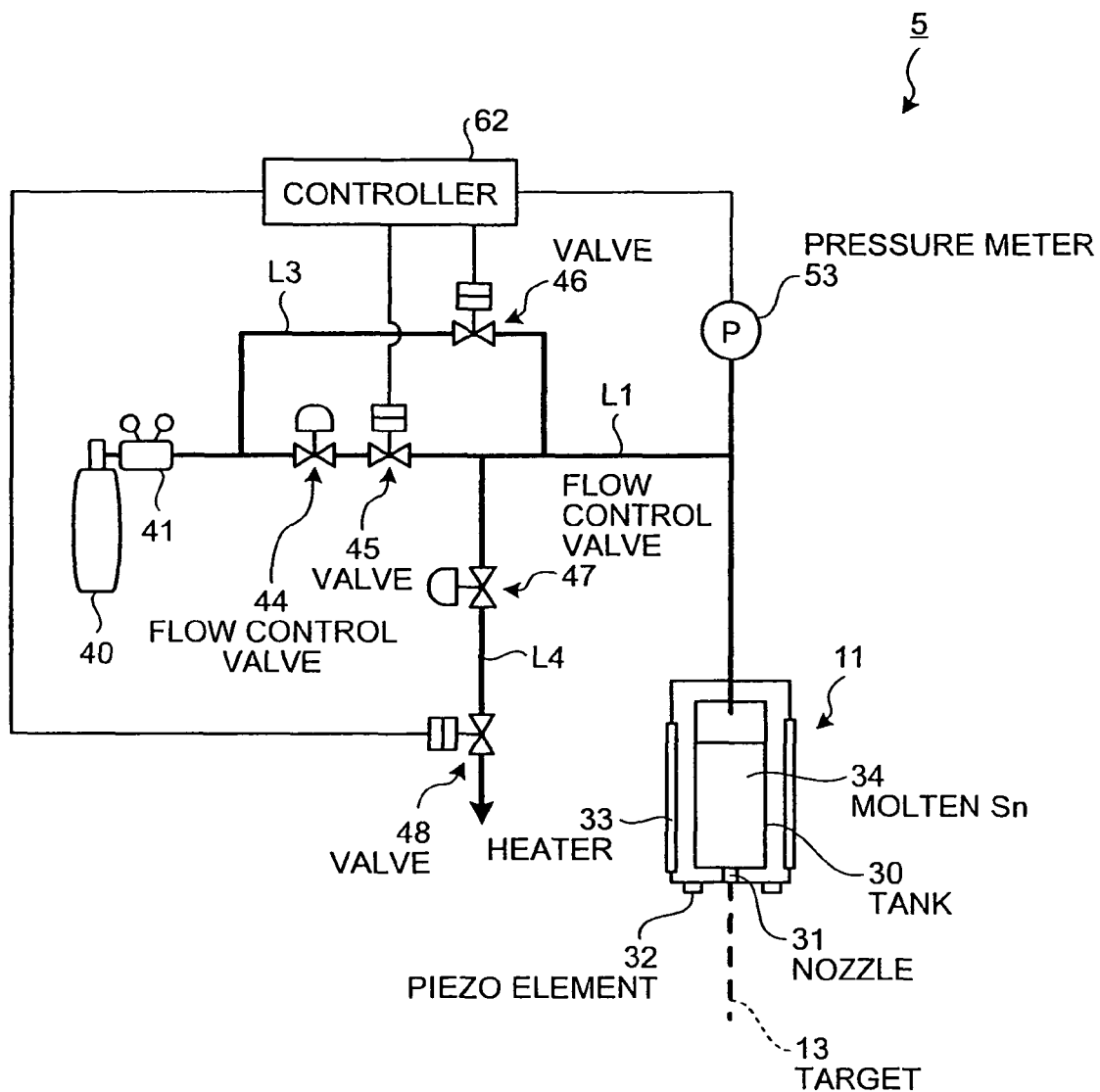
FIG. 10 is a schematic diagram showing a detailed structure of a target supply apparatus according to a fifth embodiment of the present invention.

Next, a fifth embodiment of the present invention will be described in detail. FIG. 10 is a schematic diagram showing a detailed structure of a target supply apparatus according to the fifth embodiment of the present invention. As shown in FIG. 10, a target supply apparatus 5 according to the fifth embodiment has flow control valves 44 and 47, and valves 45 and 48, corresponding to the pressure controller 51. The flow control valve 44 and the valve 45 are sequentially arranged at a side of the tank 30 on the gas passage L1, respectively. At a side of the tank 30 of the valve 45, a gas passage L4 for exhaust is arranged, the gas passage L4 branching from the gas passage L1 while one end of the gas passage L4 is an outlet. On the gas passage L4, the flow control valve 47 and the valve 48 are sequentially arranged from a branch point of the gas passage L1. Moreover, as with the above-described fourth embodiment, because the gas passage L3 being the bypass line of the gas passage L1 is arranged, the passes between the pressure regulator 41 and the flow control valve 44 and between a branch point of the gas passage L4 and the tank 30 are bypassed, respectively. Furthermore, on the gas passage L3, the valve 46 corresponding to the valve 43 is arranged. Furthermore, the pressure meter 53 detecting the intrinsic pressure of the gas passage L1 near the tank 30, respectively. The rest of the structure is the same as the target supply apparatus 4 shown in FIG. 8, and the same reference numbers will be used for referring to the parts that are the same as the parts in the first embodiment.

In the fifth embodiment, the pressure control corresponding to the pressure controller 51 is executed by using the flow control valves 44 and 47 and the valves 45 and 48. The gas flow is adjusted by the flow control valves 44 and 47. A controller 62 measures an intrinsic pressure using the pressure meter 53, and when the intrinsic pressure decreases, raises the pressure by opening the valve 45 for introducing the gas into tank 30. On the other hand, when the pressure increases, the controller 62 reduces the pressure by opening the valve 48 for evacuating the gas. That is, in the fifth embodiment, by combining pressurization and depressurization (evacuation), high-precision pressure control is executed. In the fifth embodiment, as with the fourth embodiment, it is possible to execute pressure rising via the gas passage L3 in a short time.

Figure 11:
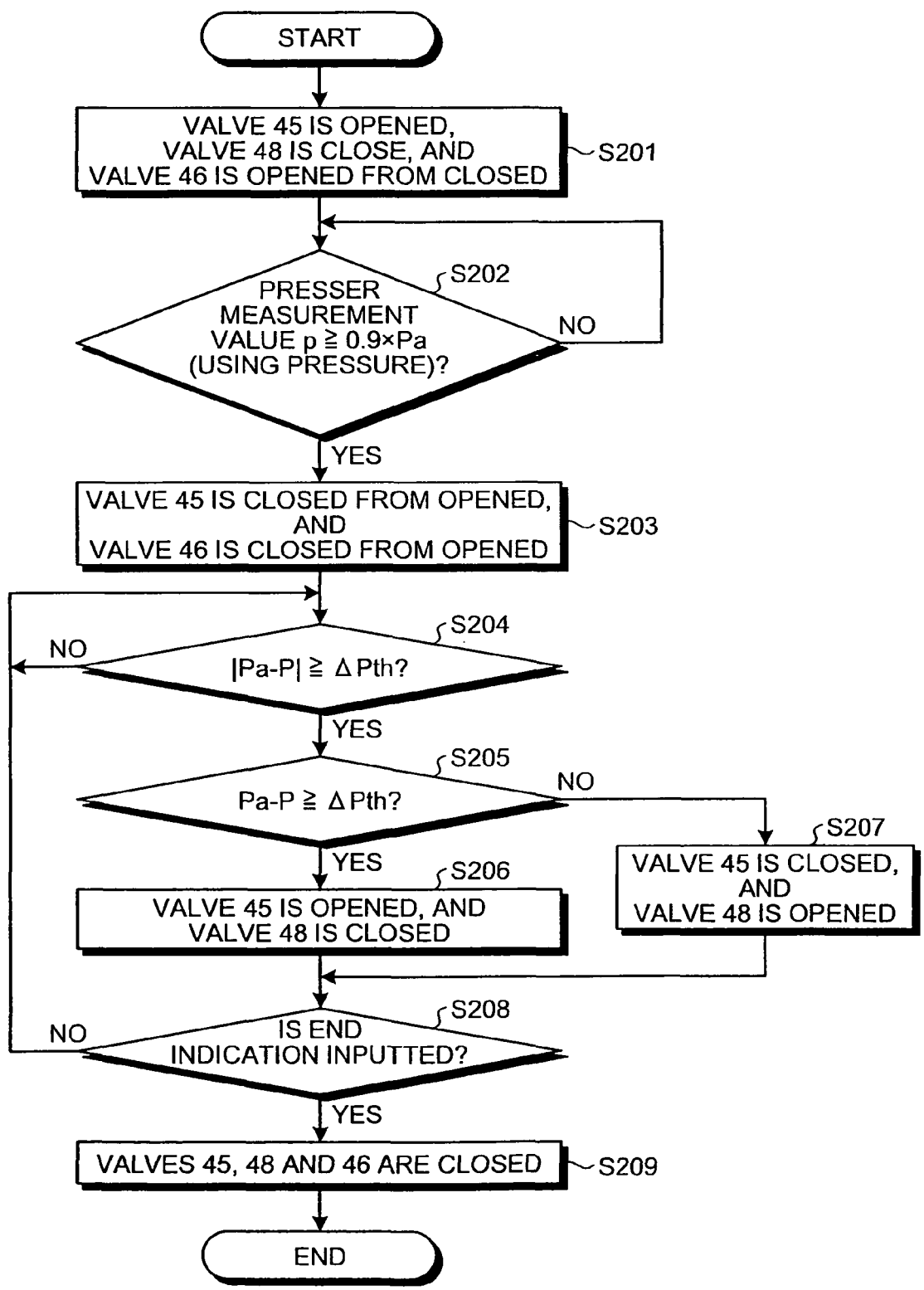
FIG. 11 is a flowchart showing a pressure control process procedure by a controller shown in FIG. 10.

Here, a gas pressure control process procedure inside the tank 30 by the controller 62 will be described in detail with reference to a flowchart shown in FIG. 11. In FIG. 11, firstly, the controller 62 opens the valve 46 from a close state while it keeps the valves 45 and 48 at close states (step S201). Thereby, because the gas flows into the tank 30 via the gas passage L3 as a large flow, pressure rising inside the tank 30 is executed in a short time.

After that, the controller 62 determines whether or not a pressure measurement value P detected by the pressure meter 53 becomes equal to or greater than 90% of using pressure Pa inside the tank 30 for jetting the target 13 (step S202). If the pressure measurement value P is not equal to or greater than 90% of the using pressure Pa (step S202, No), the controller 62 repeats the determination process in step S202. On the other hand, if the pressure measurement value P is equal to or greater than 90% of the using pressure Pa (step S202, Yes), the controller 62 closes the valve 46 from the open state while it opens the valve 45 from the close state (step S203), and proceeds to the high-precision pressure control mode from the pressure rising phase.

After that, the controller 62 determines whether or not a difference between an absolute value of the pressure measurement value P and an absolute value of the using pressure Pa is equal to or greater than a predetermined differential pressure Δ Pth (step S204), and if the difference is not equal to or greater than the predetermined differential pressure Δ Pth (step S204, No), the controller 62 repeats the determination process in step S204. On the other hand, if the difference is equal to or greater than the predetermined differential pressure Δ Pth (step S204, Yes), the controller 62 subsequently determines whether or not a value obtained by subtracting the pressure measurement value P from the using pressure Pa is equal to or greater than zero (step S205). That is, the controller 62 determines whether or not the pressure inside the tank 30 is equal to or less than the using pressure Pa. If the pressure inside the tank 30 is equal to or less than the using pressure Pa (step S205, Yes), the controller 62 raises the pressure inside the tank 30 with a flow rate controlled by the flow control valve 44 by closing the valve 48 while opening the valve 45 (step S206). On the other hand, if the pressure inside the tank 30 is not equal to or less than the using pressure Pa (step S205, No), the controller 62 evacuates the gas inside the tank 30 with a flow rate controlled by the flow control valve 47 by opening the valve 48 while closing the valve 45 (step S207) in order to reduce the pressure inside the tank 30.

After that, the controller 62 determines whether or not an end instruction has been inputted from a main controller (not shown), or the like, (step S208). If the end instruction has not been inputted (step S208, No), the controller 62 proceeds to step S204 and continues the high-precision pressure control by the flow control valves 44 and 47 and the valves 45 and 48. On the other hand, if the end instruction has been inputted (step S208, Yes), the controller 62 closes the valves 45, 48 and 46 (step S209), and then, finishes this operation.

Figure 12:
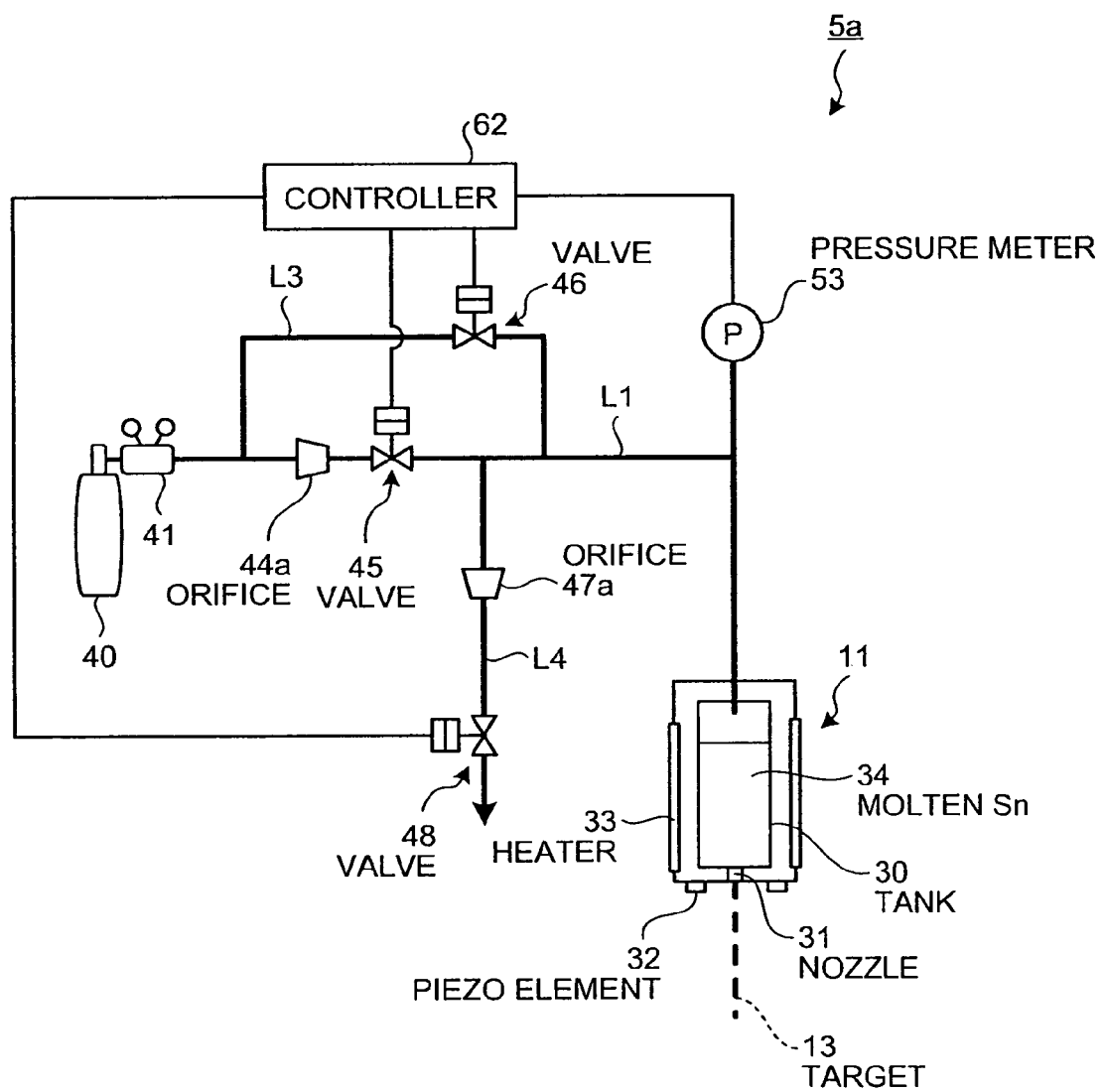
FIG. 12 is a schematic diagram showing a detail structure of a target supply apparatus according to an alternate example of the fifth embodiment of the present invention.

In addition, as with a target supply apparatus 5a shown in FIG. 12, orifices 44a and 47a for limiting flow rates can be used instead of the flow control valves 44 and 47.

As described above, in the fifth embodiment, the gas passage L3 bypassing the flow control valves 44 and 47, and 45 and 48 is arranged in order to pressurize the tank 30 via the gas passage L3 when raising the gas pressure in the tank 30, while the flow control valves 44 and 47 and the valves 45 and 48 for executing pressurization and evacuation are arranged between the pressure regulator 41 and the target supply section 11 in order to execute the high-precision pressure control. Therefore, it is possible to execute the high-precision pressure control while it is possible to shorten the pressure rising time. Therefore, it is possible to reduce the velocity variation of the target 13 and suppress the variation of the focus position where the EUV light is to be focused. As a result, the extreme ultraviolet light source apparatus which is able to reduce uneven exposure occurring in an exposure apparatus can be achieved. Furthermore, as with the first embodiment described above, because the heater 33 for maintaining the temperature of the molten Sn 34 is arranged, it is possible to reduce the velocity variation of the target 13 and suppress the variation of the position where the EUV light is to be focused. As a result, the extreme ultraviolet light source apparatus which is able to reduce an exposure unevenness occurring in an exposure apparatus can be achieved.

Sixth Embodiment

Next, a sixth embodiment of the present invention will be described in detail. In the above-described first to fifth embodiments and the alternate examples thereof, the continuous jet method is applied to the target supply method. Therefore, in the above-described first to fifth embodiments and the alternate examples thereof, a comparatively high pressure around several MPa to few dozens MPa is applied to the target material in the tank 30. On the other hand, in the sixth embodiment, an electrostatic drawing method is applied. In the electrostatic drawing method, an electrode is located at a position facing the nozzle head. For instance, when the nozzle head is grounded and a voltage is applied to the electrode, an electrostatic attractive force acts on the target material. By the electrostatic attractive force and the gas pressure inside the tank, the target material is outputted from the nozzle in a form of a droplet. Thus, in the target supply apparatus applying the electrostatic drawing method, the electrostatic attractive force acts by applying voltage to the electrode. Therefore, the pressure inside the tank storing the target material can be less than in the case where the continuous jet method is applied, e.g. equal to or less than 1 MPa.

Here, an example of the target supply apparatus according to the sixth embodiment will be described in detail. In the following explanation, a case where the electrostatic drawing method is applied to the target supply apparatus 1 according to the above-described first embodiment will be described. However, it is not limited to such structure, while the sixth embodiment can be applied to the above-described second to fifth embodiments and the alternate examples thereof.

Figure 13:
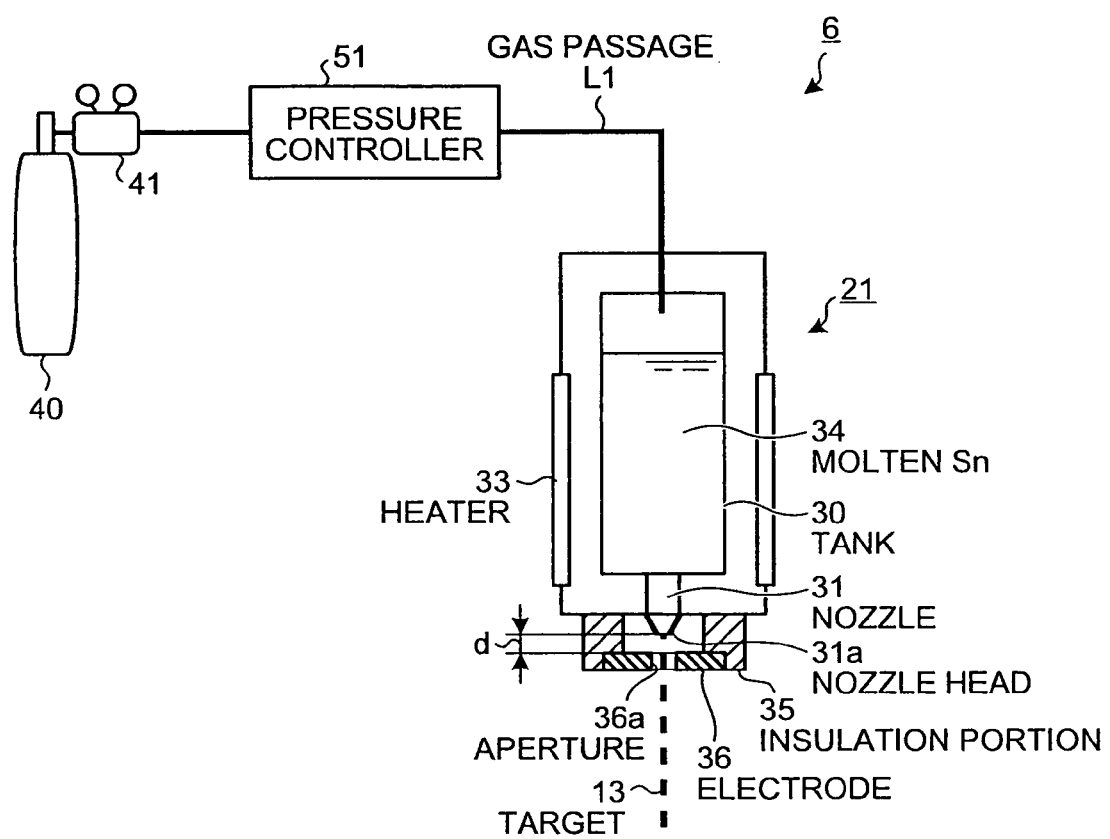
FIG. 13 is a schematic diagram showing a structure of a target supply apparatus according to a sixth embodiment of the present invention.

FIG. 13 is a schematic diagram showing a structure of a target supply apparatus according to the sixth embodiment. As shown in FIG. 13, the target supply apparatus 6 according to the sixth embodiment has the same structure as the target supply apparatus 1 shown in FIG. 2 although the target supply section 11 is replaced with a target supply section 21. The target supply section 21 has the same structure as the target supply section 11 but further has an electrode 36 facing the nozzle head 31a, and an insulation portion 35 fixing the electrode 36 to the nozzle head 31a with a certain distance d in between while insulating between the electrode 36 and the nozzle head 31a. In addition, at a part of the electrode 36 facing the nozzle 31, that is, on an output trajectory (track) of the target 13, an aperture 36a is formed for letting the target 13 pass through.

With respect to the electrode 36, a voltage signal for generating an electrical field drawing the target material from the nozzle 13 is inputted. The voltage signal can be a pulse signal such as a rectangular wave, a triangular wave or a sine (cosine) wave, or can be a constant voltage signal. Moreover, the nozzle head 31a can be grounded, or can have an electrical potential with a polarization opposite to the voltage signal. By applying a high-precision voltage signal, it is possible to maintain a force (electrostatic attractive force) drawing the target material being the molten metal from the nozzle 31 constant, therefore, stable supply of the target 13 can be achieved. Furthermore, the nozzle head 31a being a nose section is conically projected toward an output direction of the target 13. Therefore, it is possible to concentrate the electrical field formed between the electrode 36 and the nozzle 31 around the nozzle head 31a, and thereby, it is possible to effectively draw the target material from the nozzle 31 and output the target material as the target 13.

As described above, as in the above-described first to fifth embodiments and the alternate examples, in the target supply apparatus 6 applying the so-called electrostatic drawing method, which actively outputs the target 13 on demand using the electrostatic attractive force and the gas pressure inside the tank 30, it is preferable that the pressure inside the tank 30 is maintained at a constant pressure (<1 MPa).

In addition, the pressure pressurizing inside the tank can be an approximately critical value for outputting the target material (molten Sn) from the nozzle head 31a. The critical value can be represented as the following formula 3.

$$P = \frac{2\gamma}{r} - \rho \times gh \qquad \text{(formula 3)}$$

In the formula 3, γ is a surface tension of the target material, r is a radius of an aperture of the nozzle head 31a, ρ is a density of the target material, g is a gravity acceleration, and h is a height of the target material from the nozzle head 31a to an upper fluid surface.

Here, when the surface tension γ of the target material is 0.573 [N/m], the radius r of the aperture of the nozzle head 31a is 5 [μm], the density ρ of the target material is 7000 [kg/m$^3$], the gravity acceleration g is 9.8 [N/s], and the height h of the target material from the nozzle head 31a to the upper fluid surface is 0.2 [m], the critical value of the gas pressure P becomes 215 [kPa]. Thus, it is necessary to suppress an allowable variation range in the intrinsic pressure of the tank 30 to 1000 Pa or less, preferably to 600 Pa or less, or further preferably to 200 Pa or less.

Moreover, in the case where the electrostatic drawing method is used, in order to further improve an output stability of the target material, the allowable variation range in the intrinsic pressure of the tank 30 should be even more 5% or less of the intrinsic pressure, this value being about ±10 Pa, for instance. Thus, by suppressing the pressure variation range inside the tank 30 to be within ±10 Pa or less, it is possible to reduce the velocity variation of the target 13 and suppress the variation of the position where the EUV light is to be focused. As a result, the extreme ultraviolet light source apparatus which is able to reduce uneven exposure occurring in an exposure apparatus can be achieved.

In addition, because the sixth embodiment also have, due to the heater 33 maintaining the temperature of the molten Sn 34, it is possible to reduce the velocity variation of the target 13 and suppress the variation of the position where the EUV light is to be focused. As a result, the extreme ultraviolet light source apparatus which is able to reduce uneven exposure occurring in an exposure apparatus can be achieved.

As described above, according to each embodiment of the present invention, it is possible to suppress the pressure variation inside the tank by executing higher precision pressure regulation than the pressure regulator, using the high-precision pressure regulator arranged on the gas passage between the pressure regulator and the tank storing the target which is to be jetted. Therefore, it is possible to reduce uneven exposure caused by the variation of the position where the extreme ultraviolet light is to be focused.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents. Furthermore, the above-mentioned embodiments and the alternate examples can be arbitrarily combined with one another.

What is claimed is:

1. A target supply apparatus comprising:
   a tank having a nozzle and configured to store a liquid target material to be outputted from the nozzle by a pressure of gas;
   a gas supply configured to supply the gas into the tank;
   a gas passage connecting the gas supply and the tank and configured to introduce the gas supplied from the gas supply into the tank;
   a first pressure regulator located between the gas passage and the tank in the gas passage, and configured to regulate a pressure of the gas flowing out from the gas supply; and
   a second pressure regulator located between the first pressure regulator and the tank in the gas passage, and configured to regulate pressure of the gas flowing in the gas passage, a regulating accuracy of the second pressure regulator being higher than a regulating accuracy of the first pressure regulator.

2. The target supply apparatus according to claim 1, further comprising:
   a heat regulator covering the tank and configured to maintain temperature of an inside of the tank at a temperature equal to or greater than a melting temperature of the target material.

3. The target supply apparatus according to claim 1, further comprising:
   a heat regulator covering the gas passage between the first pressure regulator and the tank, and configured to make an internal temperature of the tank close to a temperature of the gas passage.

4. The target supply apparatus according to claim 1, further comprising:
   a pressure meter configured to detect an intrinsic pressure of the gas passage near the tank; and
   a controller configured to control the second pressure regulator based on a measurement of the pressure meter.

5. The target supply apparatus according to claim 1, further comprising:
   a measurement-purpose gas passage directly connected to the tank;
   a pressure meter configured to detect an intrinsic pressure of the measurement-purpose gas passage; and
   a controller configured to control the second pressure regulator based on a measurement of the pressure meter.

6. The target supply apparatus according to claim 1, further comprising:
   a bypass gas passage bypassing the second pressure regulator;
   a valve arranged on the bypass gas passage; and
   a controller configured to execute a pressure regulation of the inside of the tank using the second pressure regulator in which the valve is opened in order to let the gas flow into the inside of the tank through the bypass gas passage when an intrinsic pressure of the tank is raised, and the valve is closed when a predetermined time has passed or the intrinsic pressure becomes a predetermined pressure after the valve is closed.

7. The target supply apparatus according to claim 1, wherein the target material is outputted from the nozzle arranged at the tank by an intrinsic pressure of the tank.

8. The target supply apparatus according to claim 7, further comprising:
   a heat regulator covering the tank and configured to maintain temperature of an inside of the tank at a temperature equal to or greater than a melting temperature of the target material.

9. The target supply apparatus according to claim 7, further comprising:
   a heat regulator covering the gas passage between the first pressure regulator and the tank, and configured to make an internal temperature of the tank close to a temperature of the gas passage.

10. The target supply apparatus according to claim 7, further comprising:
    a pressure meter configured to detect the intrinsic pressure of the gas passage near the tank; and
    a controller configured to control the second pressure regulator based on a measurement of the pressure meter.

11. The target supply apparatus according to claim 7, further comprising:
    a measurement-purpose gas passage directly connected to the tank;
    a pressure meter configured to detect the intrinsic pressure of the measurement-purpose gas passage; and
    a controller configured to control the second pressure regulator based on a measurement of the pressure meter.

12. The target supply apparatus according to claim 7, further comprising:
    a bypass gas passage bypassing the second pressure regulator;
    a valve arranged on the bypass gas passage; and
    a controller configured to execute a pressure regulation of the inside of the tank using the second pressure regulator in which the valve is opened in order to let the gas flow into the inside of the tank through the bypass gas passage when the intrinsic pressure of the tank is raised, and the valve is closed when a predetermined time has passed or the intrinsic pressure becomes a predetermined pressure after the valve is closed.

13. The target supply apparatus according to claim 1, further comprising:
    an electrode located at a position facing the nozzle, wherein
    the target material is outputted from the nozzle by an intrinsic pressure of the tank and by an electrostatic attractive force occurred by having a voltage supplied to the electrode.

14. The target supply apparatus according to claim 13, further comprising:
    a heat regulator covering the tank and configured to maintain temperature of an inside of the tank at a temperature equal to or greater than a melting temperature of the target material.

15. The target supply apparatus according to claim 13, further comprising:
    a heat regulator covering the gas passage between the first pressure regulator and the tank, and configured to make an internal temperature of the tank close to a temperature of the gas passage.

16. The target supply apparatus according to claim 13, further comprising:
    a pressure meter configured to detect the intrinsic pressure of the gas passage near the tank; and
    a controller configured to control the second pressure regulator based on a measurement of the pressure meter.

17. The target supply apparatus according to claim 13, further comprising:
    a measurement-purpose gas passage directly connected to the tank;
    a pressure meter configured to detect the intrinsic pressure of the measurement-purpose gas passage; and
    a controller configured to control the second pressure regulator based on a measurement of the pressure meter.

18. The target supply apparatus according to claim 7, further comprising:
- a bypass gas passage bypassing the second pressure regulator;
- a valve arranged on the bypass gas passage; and
- a controller configured to execute a pressure regulation of the inside of the tank using the second pressure regulator in which the valve is opened in order to let the gas flow into the inside of the tank through the bypass gas passage when the intrinsic pressure of the tank is raised, and the valve is closed when a predetermined time has passed or the intrinsic pressure becomes a predetermined pressure after the valve is closed.

19. The target supply apparatus according to claim 1, wherein the second pressure regulator comprises:
- a first flow control valve arranged on the gas passage between the first pressure regulator and the tank;
- a first opening/closing valve configured to open and close a flow of gas directed to the first flow control valve;
- a branch gas passage branching from the gas passage at a side of the tank with respect to the first flow control valve and the first opening/closing valve, one end of the branch gas passage forming an outlet;
- a second flow control valve arranged on the branch gas passage;
- a second opening/closing valve configured to open and close a flow of gas directed to the second flow control valve;
- a pressure meter configured to detect an intrinsic pressure of the gas passage near the tank; and
- a controller configured to execute pressurizing control through the first flow control valve by opening the first opening/closing valve and closing the second opening/closing valve when a measurement of the pressure meter becomes under a using pressure of the inside of the tank, and to execute an exhaust control through the second flow control valve by closing the first opening/closing valve and opening the second opening/closing valve when the measurement of the pressure meter becomes over the using pressure of the inside of the tank.

20. The target supply apparatus according to claim 19, wherein the first flow control valve and the second flow control valve are orifices.

21. The target supply apparatus according to claim 19, further comprising:
- a bypass gas passage bypassing the first flow control valve and the first opening/closing valve; and
- a valve arranged on the bypass gas passage, wherein
- the controller makes the gas flow into the tank through the bypass gas passage by closing the first opening/closing valve and the second opening/closing valve and opening the valve when the intrinsic pressure of the tank is raised, and makes the intrinsic pressure close to the using pressure while repressing pressure variation by closing the valve and controlling open and close of the first opening/closing valve and the second opening/closing valve when a predetermined time has passed or the intrinsic pressure of the tank becomes a predetermined pressure after the first opening/closing valve and the second opening/closing valve are closed while the valve is opened.

22. The target supply apparatus according to claim 21, wherein the first flow control valve and the second flow control valve are orifices.

23. The target supply apparatus according to claim 1, wherein the first pressure regulator is set to be at a first pressure that is higher than a second pressure being set to the second pressure regulator.

24. The target supply apparatus according to claim 1, wherein the tank has a vibration element configured to vibrate the nozzle so that the liquid target material in the tank is outputted from the nozzle as a droplet.

25. The target supply apparatus according to claim 24, wherein the vibration element is a piezoelectric element.

26. The target supply apparatus according to claim 1, wherein the liquid target material is either molten liquid Sn or molten liquid Li.

* * * * *